(12) United States Patent
Shinohara et al.

(10) Patent No.: US 6,344,363 B1
(45) Date of Patent: Feb. 5, 2002

(54) METHOD OF MAKING FERROELECTRIC FILM WITH PROTECTIVE COVER FILM AGAINST HYDROGEN AND MOISTURE

(75) Inventors: Rika Shinohara; Atsuhiro Tsukune; Hiroshi Kudo, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/143,099

(22) Filed: Aug. 28, 1998

(30) Foreign Application Priority Data

Feb. 18, 1998 (JP) .......................................... 10-036314

(51) Int. Cl.$^7$ ......................... H01L 21/00; H01L 21/31; H01L 21/409; H01L 21/469
(52) U.S. Cl. ............................ 438/3; 438/788; 438/787; 438/778
(58) Field of Search ............................ 438/788, 3, 787, 438/240, 758, 533, 333, 336, 763, 778, 624; 364/145, 149; 257/295, 310, 637

(56) References Cited

U.S. PATENT DOCUMENTS

| | | | | |
|---|---|---|---|---|
| 4,309,240 A | * | 1/1982 | Zaferes ........................ | 15/611 |
| 5,523,595 A | * | 6/1996 | Takenaka et al. ............ | 257/295 |
| 5,591,663 A | * | 1/1997 | Nasu et al. .................... | 437/60 |
| 5,679,606 A | * | 10/1997 | Wang et al. ................. | 437/195 |
| 5,840,200 A | * | 11/1998 | Nakagawa et al. ............ | 216/6 |

FOREIGN PATENT DOCUMENTS

| | | |
|---|---|---|
| JP | 7-263637 | 10/1995 |
| JP | 8-37282 | 2/1996 |

* cited by examiner

*Primary Examiner*—Olik Chaudhuri
*Assistant Examiner*—Shrinivas H. Rao
(74) *Attorney, Agent, or Firm*—Armstrong, Westerman, Hattori, McLeland & Naughton LLP

(57) ABSTRACT

A ferroelectric film is formed on a principal surface of an underlying substrate. By the vapor deposition using high density plasma, an insulating protection film is deposited so that the ferroelectric film is covered therewith. The deposited protection film can prevent the ferroelectric film from deteriorating.

10 Claims, 8 Drawing Sheets

METHOD OF MAKING FERROELECTRIC FILM WITH PROTECTIVE COVER FILM AGAINST HYDROGEN AND MOISTURE

This application is based on Japanese Patent Application No. 10-36314 filed on Feb. 18, 1998, the entire contents of which are incorporated herein by reference.

BACKGROUND OF THE INVENTION a) Field of the Invention

The present invention relates to a method of manufacturing a semiconductor device using a ferroelectric film and the device manufactured thereby, more particularly to a method of manufacturing the device whose ferroelectric film is coated with a protection film, and the device manufactured thereby. For example, the ferroelectric film is used as a dielectric layer of a ferroelectric capacitor incorporated in a semiconductor integrated circuit.

b) Description of the Related Art

A non-volatile memory device having ferroelectric capacitors has been used in an IC card, or the like. Because the characteristics of a ferroelectric material deteriorate when it is exposed to a hydrogen atmosphere, it is preferred that the ferroelectric material be manufactured under an atmosphere with little hydrogen. An SiN film is used as a protection film of a regular semiconductor integrated circuit. The ammonia gas is used as a source gas for depositing the SiN film under high temperature. Therefore, the SiN film is not suitable for the protection film of the integrated circuit having the ferroelectric capacitors. An $SiO_2$ film which is deposited by means of a diode parallel plates plasma CVD apparatus is usually used for the protection film.

A conventional protection film does not completely prevent the ferroelectric film from deteriorating, therefore, the deterioration of the electric characteristics of the ferroelectric capacitor often occurs.

SUMMARY OF THE INVENTION

An object of the present invention to provide a method for forming a protection film which can prevent a ferroelectric film from deteriorating, and a device using the protection film.

According to one aspect of the present invention, there is provided a method for manufacturing a device using a ferroelectric film, the method comprising a forming step of forming a ferroelectric film on a principal surface of an underlying substrate, and a depositing step of depositing an insulating protection film so that the ferroelectric film is covered with the protection film, by a vapor deposition process using high density plasma.

The density of the protection film deposited with the high density plasma is high, and thus deposited protection film has high moisture resistivity.

According to another aspect of the present invention, there is provided a method of manufacturing a device using a ferroelectric film, the method comprising a forming step of forming a ferroelectric film on a principal surface of an underlying substrate, a heating step of heating the underlying substrate and the ferroelectric film, and a depositing step of depositing a protection film after the heating step so that the ferroelectric film is coated with the protection film, without exposing the underlying substrate to the atmosphere.

The heating of the underlying substrate before the protection film deposition evaporates the moisture on the substrate. As a result, the ferroelectric film is prevented from deteriorating.

According to still another aspect of the present invention, there is provided a method of manufacturing a device using a ferroelectric film comprising a forming step of forming a ferroelectric film on a principal surface of an underlying substrate, and a depositing step of depositing a protection film of fluorine added silicon oxide so that the ferroelectric film is coated with the protection film, using source gases each having no bonding of with Si and H.

Using the gases without bonding of Si and H prevents the protection film from taking the hydrogen atoms therein. Reduction of hydrogen in the protection film mitigates a bad influence upon the ferroelectric film in the manufacturing steps which occur afterwards.

According to a further aspect of the present invention, there is provided a device using a ferroelectric film, the device comprising an underlying substrate having a principal surface, a ferroelectric film formed on the principal surface of the underlying substrate, and a protection film of silicon oxide formed so that the ferroelectric film is coated with the protection film wherein peak height of the Fourier transform infrared spectroscopy which corresponds to bonding of Si and H is lower than 2% of maximum peak height corresponding to bonding of Si and O.

Reduction of the hydrogen in the protection film mitigates a bad influence upon the ferroelectric film in the manufacturing steps thereafter.

According to a still further aspect of the present invention, there is provided a device using a ferroelectric film, the device comprising an underlying substrate having a principal surface, a ferroelectric film formed on the principal surface of the underlying substrate, and a protection film of fluorine added silicon oxide formed on the ferroelectric film.

If an $SiF_4$ gas is used as a source gas for depositing a protection film comprising Si. Thus deposited protection film takes fluorine atoms therein. In this case, the quantity of hydrogen atoms in the protection film is reduced to less than that of a protection film deposited with a source gas such as $SiH_4$ which includes hydrogen atoms.

As described in the above, a ferroelectric film is coated with a protection film having high moisture resistivity so as to be prevented from being moistened. Thus, the ferroelectric film is prevented from deteriorating. In the case of a capacitor using the ferroelectric film, the characteristics of the capacitor is prevented from deteriorating.

DETAILED DESCRIPTION OF THE PREFERRED EMBODIMENTS

Figure 1:
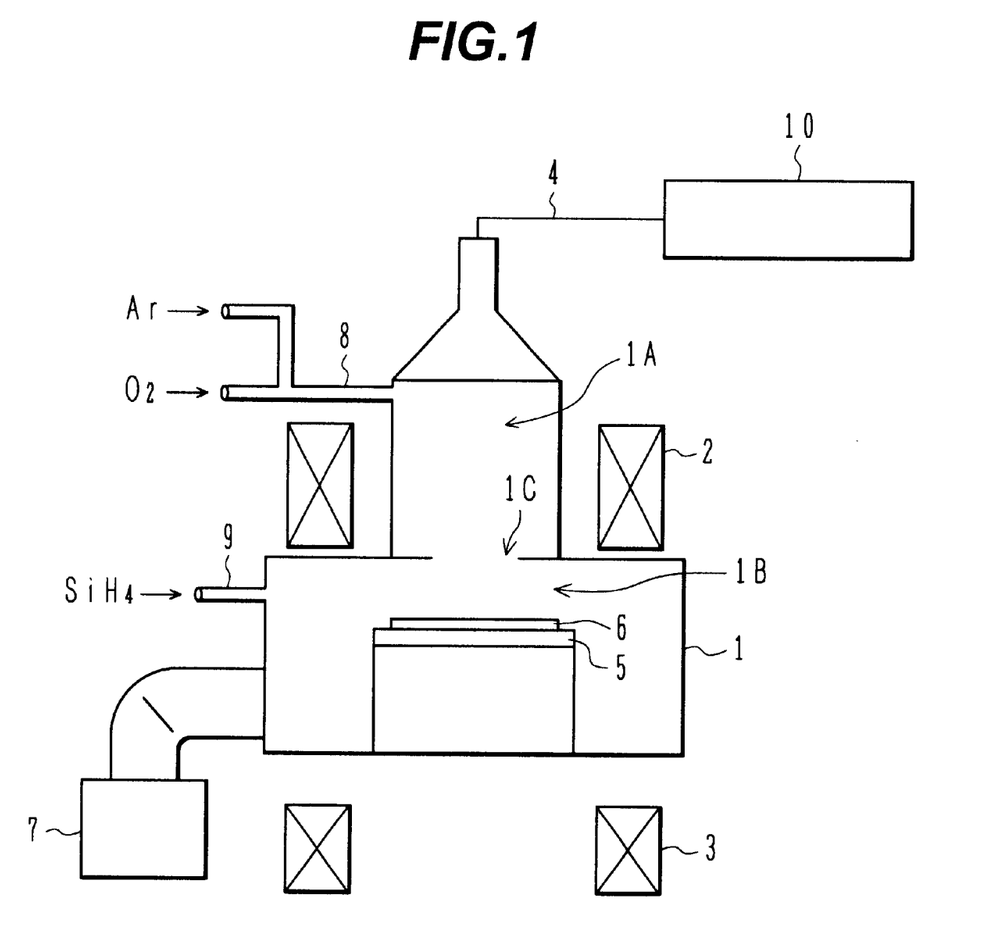
FIG. 1 is a schematic diagram showing an ECR plasma CVD apparatus.

FIG. 1 is a schematic view of a chemical vapor deposition apparatus using electron cyclotron resonance plasma (ECR plasma CVD apparatus) used in the first embodiment of the present invention. A process chamber 1 comprises a plasma generating chamber 1A and a reaction chamber 1B. There is a plasma withdrawal window 1C between the plasma generating chamber 1A and the reaction chamber 1B. A turbo-molecular pump 7 vacuums the process chamber 1.

A main solenoid coil 2 is arranged around the plasma generating chamber 1A. A magnetic field appears in the plasma generating chamber 1A when a current is supplied to the main solenoid coil 2. A sub solenoid coil 3 is arranged under the process chamber 1. The main solenoid coil 2 and the sub solenoid coil 3 are coaxial.

A wave guide 4 communicates with the plasma generating chamber 1A. A microwave source 10 outputs microwaves to the plasma generating chamber 1A via the wave guide 4. Argon gas and $O_2$ gas are led to the plasma generating chamber 1A via a gas pipe 8. The electron cyclotron resonance occurs in the plasma generating chamber 1A and generates plasma. The generated plasma travels down to the reaction chamber 1B through the plasma withdrawal window 1C.

There is a table 5 for supporting a substrate in the reaction chamber 1B. A substrate 6 is fixed on the table 5 with the electrostatic chuck. The maximum diameter of a wafer to be placed on the table 5 is, for example, 6 inches. The table 5 is kept electrically in a floating state. $SiH_4$ gas is led in the reaction chamber 1B via a gas pipe 9. The $SiH_4$ gas reacts with the plasma oxygen, and $SiO_2$ is deposited on the substrate 6.

This underlying substrate is a silicon substrate on which a phosphosilicate glass (PSG) film having a thickness of 700 nm is stacked an $SiO_2$ film having a thickness of 500 nm is deposited on an underlying substrate with the ECR plasma CVD apparatus shown in FIG. 1. The deposition is performed under the following conditions: the flow rate of the $SiH_4$ gas is 77 sccm; the flow rate of the Ar gas is 150 sccm; a flow rate of the $O_2$ gas is 103 to 193 sccm; the pressure in the process chamber 1 is 0.29 Torr, the temperature of the substrate is 250° C.; amperage of the currents supplied to the main and sub solenoid coils 2 and 3 is 200 A; and the microwave source 10 outputs microwaves of 1.75 kW.

A pressure cooker test (PCT) is carried out on the underlying substrate on which the $SiO_2$ film has been deposited by the method described in the above first embodiment in order to evaluate the moisture resistivity of the $SiO_2$ film. The conditions for the PCT are as follows: the temperature is 120° C.; the applied pressure is 2 atm; and the humidity is 100%. The underlying substrate is evaluated twice, both before and after the PCT. A valuation basis is comparison of peak areas of an absorbency coefficient spectrum by the Fourier transform infrared spectroscopy (FT-IR spectroscopy), the peak areas corresponding to double bonding of P and O. If the PSG film under the $SiO_2$ film is moistened and the double bonding of P and O is resolved, the peak area corresponding to the double bonding of P and O reduces. That is, the reduction of the peak area corresponding to the double bonding of P and O indicates that the $SiO_2$ film does not have enough moisture resistivity.

Figure 2:
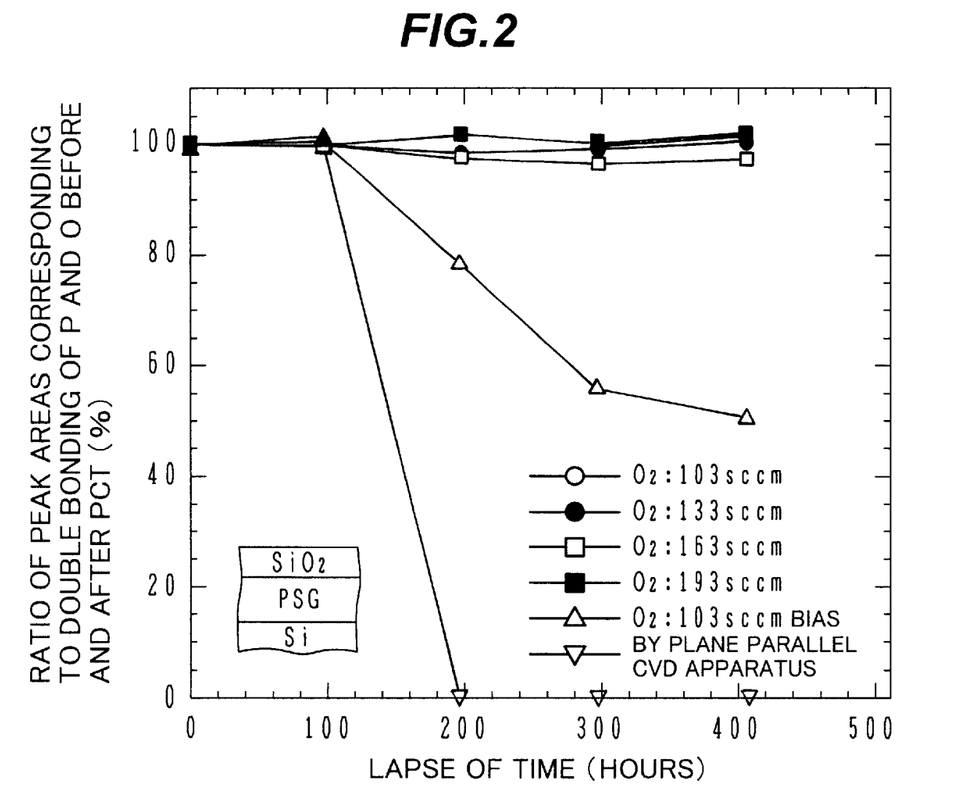
FIG. 2 is a graph showing a result of a pressure cooker test carried out on a laminate comprising of a PSG film coated with a protection film which is deposited by a method described in the first embodiment.

FIG. 2 is a graph showing reduction degree of the peak area corresponding to the double bonding of P and O after the PCT is carried out as a function of PCT time. The abscissa indicates the lapse of time since the start of the PCT as hours. The ordinate indicates area ratio $S_x/S_o$. $S_o$ represents the area of the peak of the FT-IR spectroscopy corresponding to the double bonding of P and O before the PCT is carried out, and $S_x$ represents the same after the PCT. The unit of the graph is given in percent. Symbols ○, ●, □, and ■ represent changes in the area ratio $S_x/S_o$. The symbols respectively correspond to the cases where the $O_2$ gas flow rates are 103 sccm, 133 sccm, 163 sccm and 193 sccm. Symbols △ represent changes in the area ratio $S_x/S_o$ when the $O_2$ gas is taken in at a flow rate of 103 sccm and an RF bias of 2 kW with 13.56 MHz is applied to the table 5. Symbols ▽ represent changes in the area ratio in the case where the $SiO_2$ film is deposited in a conventional diode parallel plates plasma CVD apparatus.

In the case where the diode parallel plates plasma CVD apparatus is used for the deposition, the area ratio $S_x/S_o$ decreases rapidly as the time from the start of the PCT exceeds 100 hours. In the case where the RF bias is applied to the table, the area ratio $S_x/S_o$ also starts to decrease as the time from the start of the PCT exceeds 100 hours. Those decreasing phenomena of the area ratio $S_x/S_o$ indicate that the PSG film is moistened.

On the contrary, in the case where the $SiO_2$ film is deposited without the application of the RF bias to the substrate in the ECR plasma CVD apparatus, the area ratio $S_x/S_o$ does not decrease even when the elapsed time from the start of the PCT exceeds 400 hours. This phenomenon indicates that the formed $SiO_2$ film has high moisture resistivity.

The ECR plasma CVD apparatus generates high density plasma and can form a high density film. Therefore, the moisture resistivity of the $SiO_2$ film formed in the ECR plasma CVD apparatus is higher than that of a film formed in the diode parallel plates plasma CVD apparatus using capacitive coupling plasma. The plasma CVD apparatus is not limited to the ECR plasma CVD apparatus. An apparatus which can generate plasma having a higher density than that of the capacitive coupling plasma may be used. For example, a plasma generating apparatus using inductive coupling plasma or helicon plasma may be used. Preferable electron density in the high density plasma is $1 \times 10^{12}$ cm$^{-3}$ or greater.

Application of the RF bias between the process chamber and the table is not preferred even if the high density plasma is used.

FIGS. 3A to 3D are graphs showing FT-IR spectra in the cases where the $SiO_2$ films are deposited in the ECR plasma CVD apparatus shown in FIG. 1 at the $O_2$ gas flow rates of 103 sccm, 133 sccm, 163 sccm and 193 sccm by the method described in the above first embodiment. The abscissas of the graphs indicate the wave number as cm$^{-1}$. The ordinates thereof indicate light absorbency coefficient with arbitrary scales.

Figure 3A:
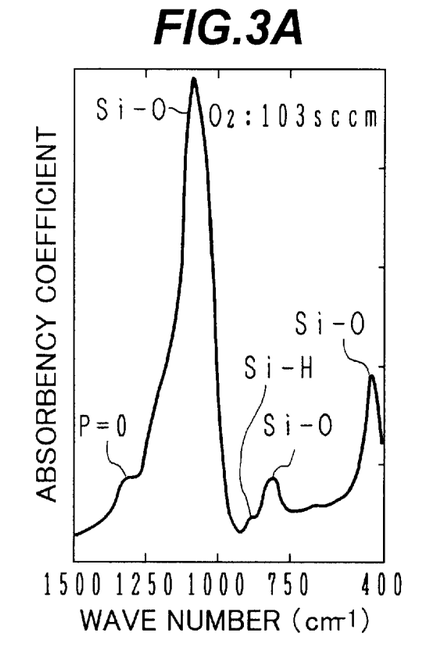
FIGS. 3A to 3D are graphs showing FT-IR spectrums of the laminate comprising the PSG film coated with the protection film which is deposited by the method described in the first embodiment.
Figure 3B:
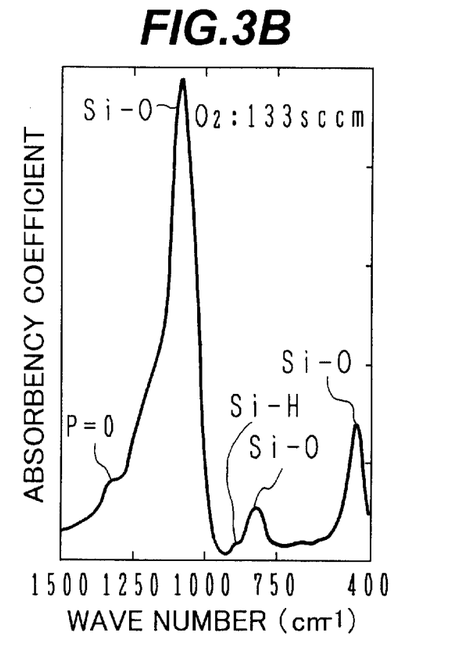
Figure 3C:
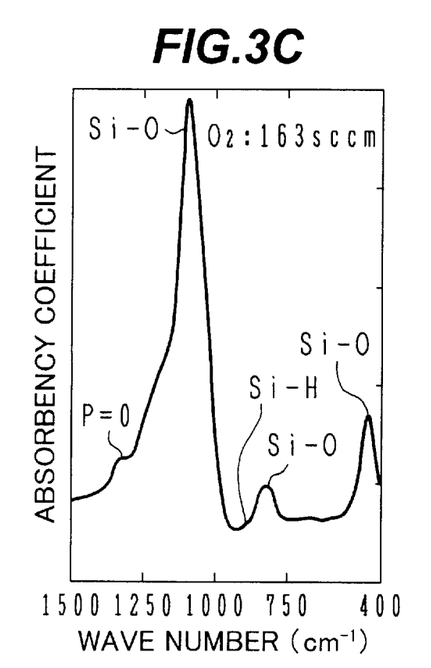
Figure 3D:
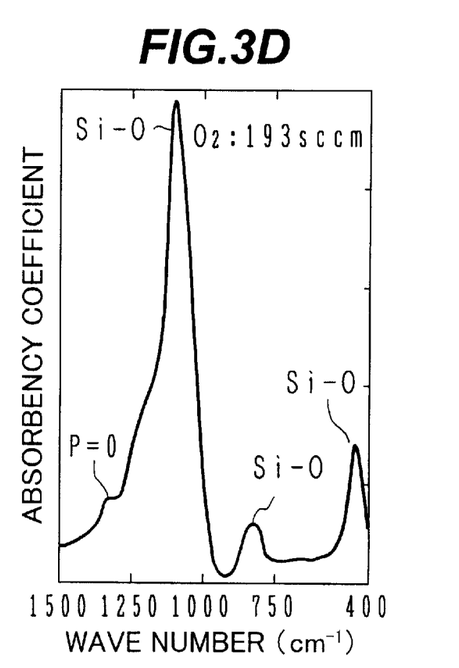

In each of the graphs, peaks corresponding to the bonding of Si and O appears at times when the wave number is about 450 cm$^{-1}$, 820 cm$^{-1}$ and 1060 cm$^{-1}$, and a small peak corresponding to the double bonding of P and O appears when the wave number is about 1300 cm$^{-1}$. In each of FIGS. 3A to 3C, a small peak corresponding to the bonding of Si and H appears when the wave number is about 850 cm$^{-1}$. In FIG. 3D, however, such a peak does not appear. Providing the O$_2$ gas at a flow rate which is relatively higher than that of the SiH$_4$ gas causes the formation of the SiO$_2$ film having a little bonding of Si and H. An SiO$_2$ film deposited with the O$_2$ gas at a flow rate which is two and half times as great as that of the SiH$_4$ gas has few hydrogen atoms, and peaks corresponding to the bonding of Si and H seldom appear.

In thus deposited SiO$_2$ film, a height of a peak in the FT-IR spectrum corresponding to the bonding of Si and H when the wave number is about 850 cm$^{-1}$ is lower than 2% of a maximum height of peaks corresponding to the bonding of Si and O when the wave number is about 1060 cm$^{-1}$. Estimated quantity of the hydrogen atoms included in the SiO$_2$ film, which is deposited under the above conditions, is 1×10$^{21}$ cm$^{-3}$ or less.

Figure 4:
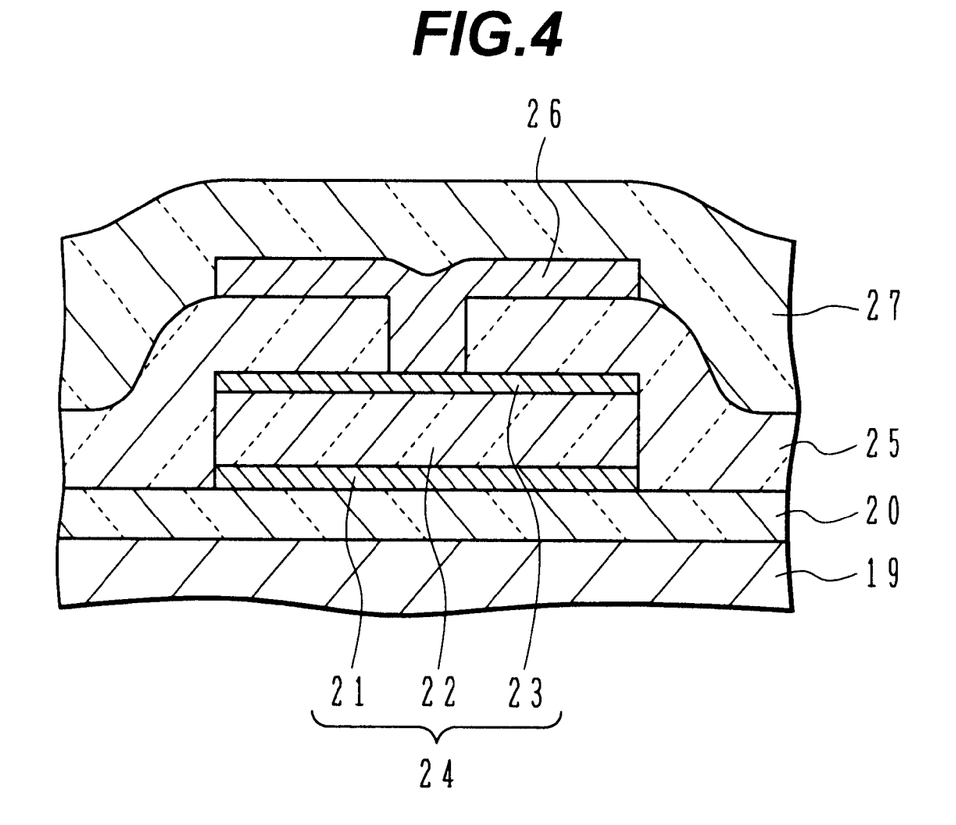
FIG. 4 is a sectional view of a device having a ferroelectric capacitor coated with a protection film which is deposited by any one of methods described in the first to third embodiments.

FIG. 4 shows a ferroelectric capacitor using the SiO$_2$ film as its protection film which is formed by the method described in the first embodiment.

An underlying substrate comprises a PSG film 20 formed on a surface of a silicon substrate 19. A ferroelectric capacitor 24 is a laminate of the lower electrode 21 having a thickness of 0.2 micrometer, a ferroelectric film 22 having a thickness of 0.3 micrometer and an upper electrode having a thickness of 0.2 micrometer. The capacitor 24 is arranged on a surface of the PSG film. The lower and upper electrodes 21 and 23 consist of, for example, platinum (Pt). The ferroelectric film 22 consists of, for example, Pb(ZrTi)O$_3$ (PZT), or the like.

For example, target platinum is sputtered in the Ar atmosphere to deposit the lower and upper electrodes 21 and 23. The PZT film is deposited by, for example, sputtering. The Pt film and the PZT film are patterned by a known dry etching method. In this etching method, the films may be physically milled partially.

An interlayer insulating 25 of SiO$_2$ having a thickness of 0.2 micrometers is formed so that the ferroelectric capacitor 24 is covered therewith. A contact hole is formed in the interlayer insulating film 25. An Al wiring 26 is connected to the upper electrode 23 via the contact hole. A protection film 27 of SiO$_2$ having a thickness of 0.7 micrometers is formed so that the wiring 26 and the interlayer insulating film 25 are coated therewith. The protection film 27 is formed by the method described in the first embodiment.

According to an evaluation of polarization versus voltage characteristics (P-V characteristics) of the ferroelectric capacitor 24 shown in FIG. 4 where the protection film 27 is deposited under the conditions that the O$_2$ gas is provided at a flow rate which is two and half times as great as that of the SiH$_4$ gas, a large Q switch (Q$_{sw}$) appears. The Q$_{sw}$ represents a difference between remanent positive polarization and remanent negative polarization in a graph showing the P-V characteristics in which no voltage is applied. On the contrary, in the case where the protection film 27 is formed under the conditions that the ratio of the O$_2$ gas flow rate to SiH$_4$ gas flow rate is small, a value of the Q$_{sw}$ of the ferroelectric capacitor is small. That is, the protection film of SiO$_2$ having a little hydrogen brings a large Q$_{sw}$ and the ferroelectric capacitor using such protection film shows good capacitor characteristics.

In the first embodiment, the SiO$_2$ film is used as the protection film. However, the material of the protection film is not limited to SiO$_2$. Any materials which can be deposited by the plasma process may be used for the film. For example, an SiN film, an SiON film, or the like may be used. In this case, for example, N$_2$ may be used as the material gas for obtaining nitrogen.

When the ratio of the O$_2$ gas flow rate to the SiH$_4$ gas flow rate is relatively high, hydrogen atoms included in SiH$_4$ are prevented from being absorbed by the SiO$_2$ film. When a source gas includes no hydrogen atoms for obtaining the silicon, the hydrogen atoms are also prevented from being absorbed by the SiO$_4$ film. A second embodiment will now be described next. In the second embodiment, a method of forming the SiO$_2$ film with a source gas including no hydrogen atoms for obtaining the silicon.

In the first embodiment, SiH$_4$ is used as the source gas for obtaining the silicon. A gas used in the second embodiment is SiF$_4$. The ECR plasma CVD apparatus shown in FIG. 1 is also used in the second embodiment. Conditions in the second embodiment are as follows: the flow rate of an SiF$_4$ gas is 70 sccm; the flow rate of the O$_2$ gas is 200 sccm; the flow rate of the Ar gas is 150 sccm; and the microwave source 10 outputs the microwaves at 2.7 kW. Other conditions are same as those of the first embodiment, and the underlying substrate used in the first embodiment is also used in this embodiment. A protection film is deposited on the PSG film by a method of the second embodiment. The protection film is a fluorine added silicon oxide (SiOF) film. After the protection film is formed by the method of this embodiment, the PCT is carried out.

Figure 5:
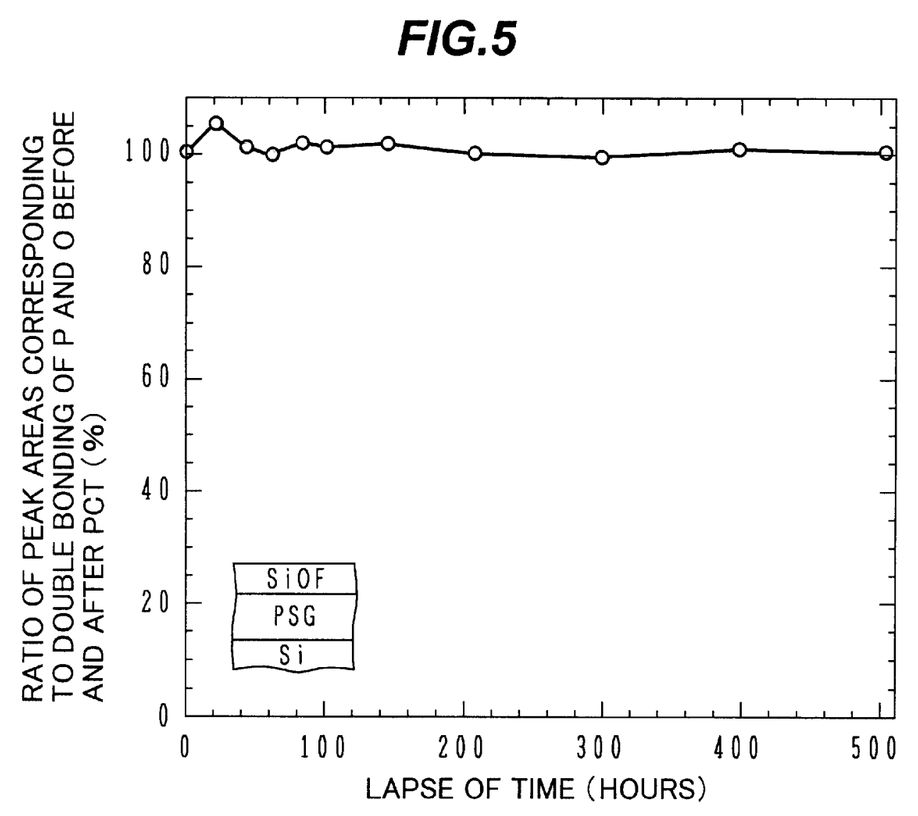
FIG. 5 is a graph showing a result of a pressure cooker test carried out on a laminate comprising a PSG film coated with a protection film which is deposited by a method described in the second embodiment.

FIG. 5 is a graph showing a result of the PCT. The abscissa and ordinate of the graph are the same as those of the graph shown in FIG. 2. It is obvious from FIG. 5 that the area ratio $S_x/S_o$ stays at almost the same level even when the lapse of time exceeds 500 hours.

An appearance of a large Q$_{sw}$ is revealed by evaluation of the electric characteristics in the ferroelectric capacitor 24 shown in FIG. 4 and having the protection film 27 which is formed by the method of the second embodiment. Because the source gas does not include the hydrogen atoms, the hydrogen atoms in the SiO$_2$ film may be fewer than those in the SiO$_2$ film described in the first embodiment.

Figure 6:
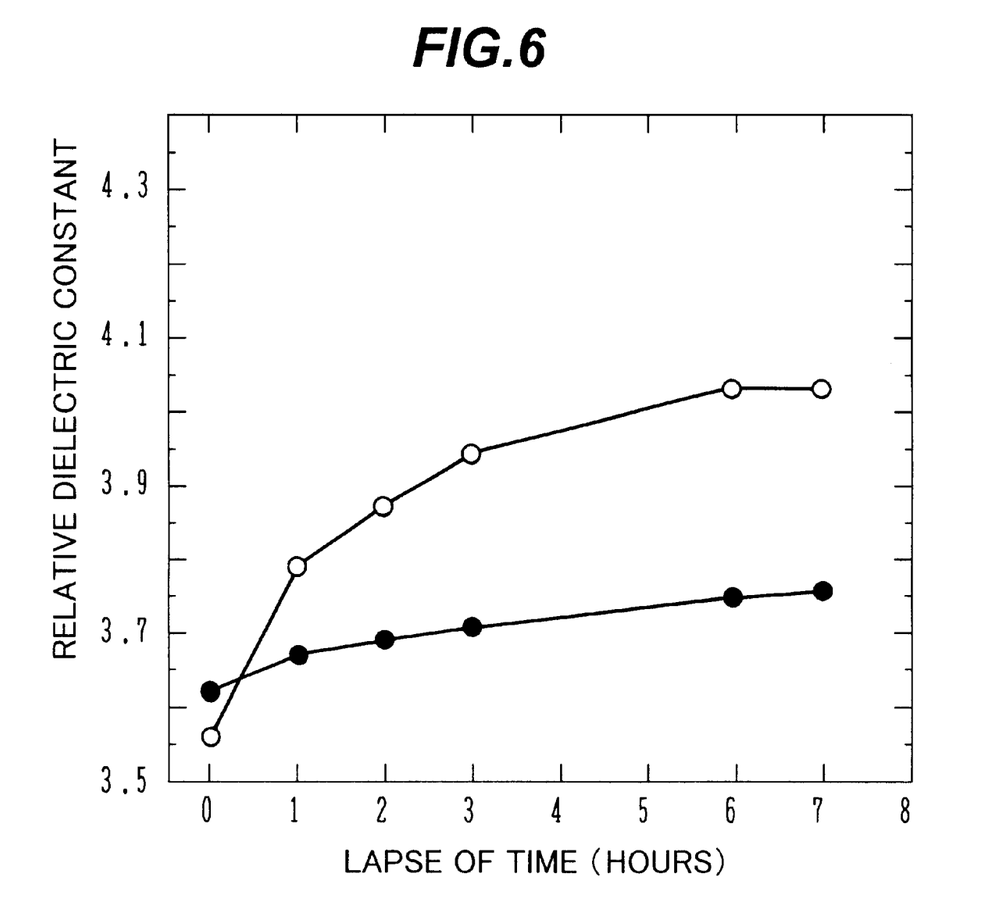
FIG. 6 is a graph showing changes in the dielectric constant of an SiOF film, which is deposited by a method described in the second embodiment, versus the lapse of time.

FIG. 6 is a graph showing changes in dielectric constants when the SiOF film formed by the method of the second embodiment is exposed to the atmosphere. The abscissa axis of the graph indicates in hours the period of time of exposure. The ordinate indicates the dielectric constants. Symbols ○ represent the changes in the relative dielectric constant of the SiOF film in the case where the relative dielectric constant at a time immediately after the deposition is approximately 3.55. Symbols ● represent changes in the dielectric constant of the SiOF film in another case where the dielectric constant at a time immediately after the deposition is approximately 3.62. The dielectric constant at a time immediately after the deposition of the SiOF film depends on the concentration of fluorine atoms in the SiOF film. The concentration of the fluorine atoms can be controlled by changing a condition for forming the SiOF film, that is, the temperature of the substrate or a flow rate ratio of the SiF$_4$ gas to the O$_2$ gas.

In the case where the dielectric constant is 3.55 at a time immediately after the SiOF film is deposited, the dielectric constant greatly increases in accordance with time. This phenomenon may be caused by moistening of the SiOF film. On the contrary, in the case where the relative dielectric constant is 3.62 immediately after the deposition, the increase in the value of the relative dielectric constant is small. According to this comparison, it is preferred that the SiOF film be formed under the condition wherein the dielectric constant at the deposition is 3.6 or greater.

A third embodiment will now be described. In this embodiment, heat treatment on the underlying substrate is carried out before the deposition of the $SiO_2$ film which is described in the first embodiment. The deposition of the $SiO_2$ film is carried out after the heat treatment of the underlying substrate. The substrate is not exposed to the atmosphere after the heat treatment. Other steps are the same as those in the first embodiment.

Conditions for the deposition in the ECR plasma CVD apparatus shown in FIG. 1 are as follows: the $SiH_4$ gas flow rate is 77 sccm; the flow rate of the $O_2$ gas is 103 sccm; the flow rate of the Ar gas is 150 sccm; and temperature of the substrate during the depositing process is 400° C. Other conditions are the same as those in the first embodiment. Before the $SiO_2$ deposition, the heat treatment is performed in the CVD apparatus for about 10 minutes under $N_2$ atmosphere with a substrate temperature of 400° C.

Similarly to the case shown in FIG. 2, the moisture resistivity of the $SiO_2$ protection film is evaluated by the FT-IR spectrum after the $SiO_2$ protection film is deposited on the PSG film under the above-described conditions. As a result, almost no decrease of the area ratio $S_x/S_o$ appears as well as the case in the first embodiment.

The ferroelectric capacitor 24 shown in FIG. 4 and having the protection film 27 which is formed by the method of the third embodiment will now be described.

Figure 7A:
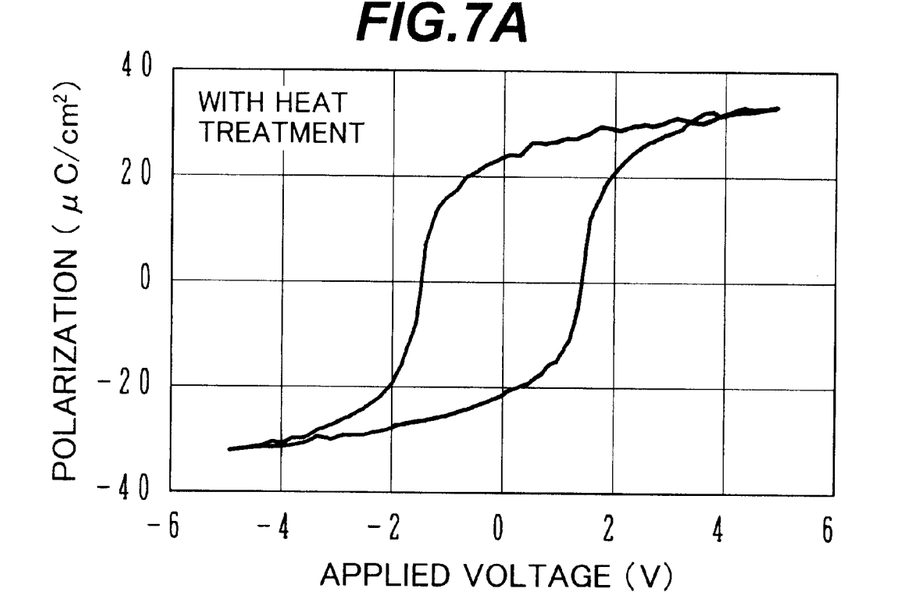
FIG. 7A is a graph showing characteristics of a ferroelectric capacitor coated with a protection film, which is deposited by a method described in the third embodiment, after a deterioration test carried out on the capacitor.
Figure 7B:
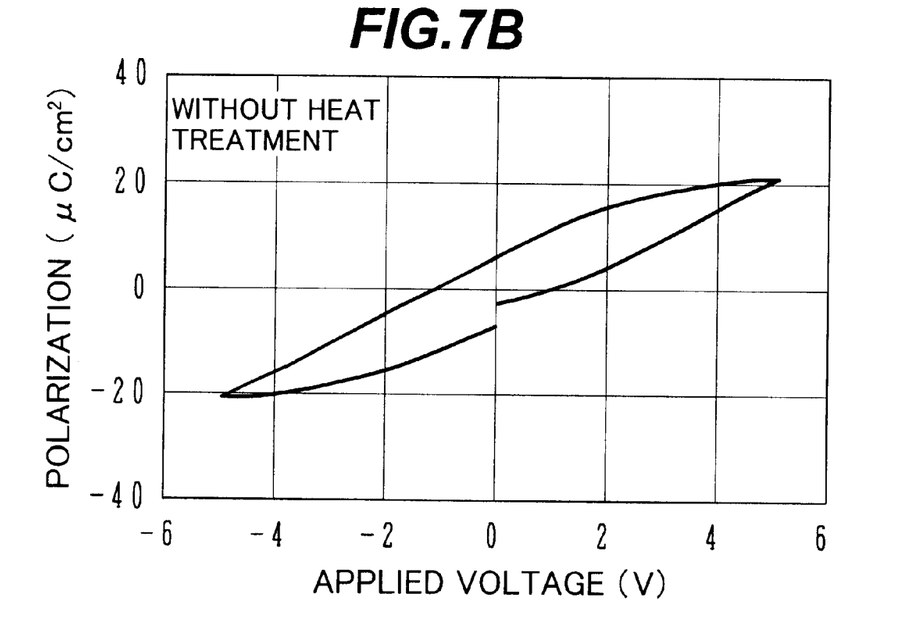
FIG. 7B is a graph showing the characteristics of the same without a heat treatment before the protection film deposition.

FIG. 7A is a graph showing polarization versus voltage characteristics of the ferroelectric capacitor whose protection film 27 is deposited by the method of the third embodiment. FIG. 7B is a graph showing polarization versus voltage characteristics of the ferroelectric capacitor without the heat treatment before the deposition of the protection film. Each of the abscissas of the graphs indicates an applied voltage. Each of the ordinates of the graphs indicates the polarization, and its unit is $\mu C/cm^2$.

As shown in FIG. 7A, relatively large hysteresis characteristics appear in the capacitor 24 which is subjected to the heat treatment before the deposition of the protection film. On the contrary, the capacitor 24 without the heat treatment shows small hysteresis characteristics. The heat treatment evaporates moisture in the ferroelectric film 22, the interlayer insulating film 25, and the like shown in FIG. 4, thus, the large hysteresis characteristics appear. Such a ferroelectric film having large hysteresis characteristics is suitable for uses the ferroelectric film of a capacitor in a non-volatile ferroelectric memory device.

According to an observation of degassing profile with a quadruple mass spectrometer (Q-MASS) during the heat treatment of the underlying substrate, the preferable heat treatment temperature for evaporation is 400° C. Therefore, it is preferred that the heat treatment be carried out under a temperature of 400° C. or greater. It is also preferred that the heat treatment be carried out in inert gas atmosphere such as $N_2$ gas or Argon gas.

In the third embodiment, the case where the heat treatment and the protection film deposition are carried out in the ECR plasma CVD apparatus sequentially is described. The heat treatment may be carried out in another apparatus and the underlying substrate after the heat treatment may be transferred to the ECR plasma CVD apparatus, without the substrate being exposed to the atmosphere.

In the third embodiment, the method of depositing the $SiO_2$ film with the high density plasma is described. This method may be effective also for the SiOF film deposition described in the second embodiment. The heat treatment before the protection film deposition may be effective also in the case of employing the conventional diode parallel plates plasma CVD apparatus.

Figure 8:
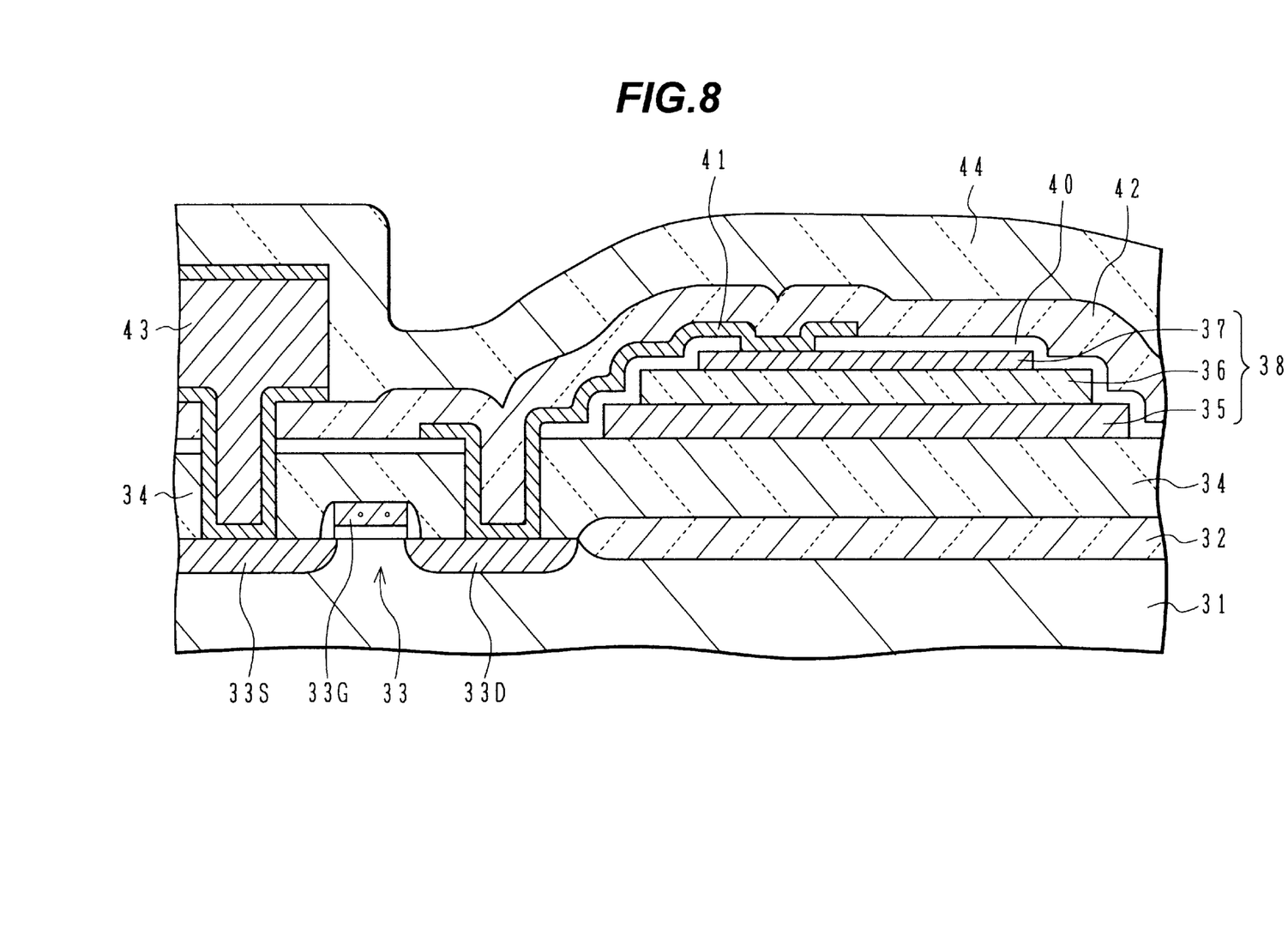
FIG. 8 is a sectional view of a ferroelectric memory device employing a protection film according to the first to third embodiments.

FIG. 8 is a sectional view exemplifying a part of a ferroelectric memory device whose protection film is formed by the methods according to the first to third embodiments. A field oxide film 32 is formed on a surface of a silicon substrate 31 so that portions to be active regions are not covered therewith. A MOS transistor 33 is formed in each of the active regions. The MOS transistor 33 comprises a source region 33S, a drain region 33D, and a gate electrode 33G.

An $SiO_2$ interlayer insulating film 34 is formed so that the MOS transistor 33 is covered therewith. A ferroelectric capacitor 38 is formed on a part of a surface of the interlayer insulating film 34. The ferroelectric capacitor 38 comprises a lower electrode 35, a ferroelectric film 36 and an upper electrode 37 and is covered with an $SiO_2$ film 40.

The drain region 33D and the upper electrode 37 are exposed via contact holes formed in the interlayer insulating film 34 and the $SiO_2$ film 40. A wiring 41 connects the drain region 33D with the upper electrode 37 via the contact holes. The winding 41 is covered with an interlayer insulating film 42.

The source region 33S is exposed via a contact hole formed through the interlayer insulating films 42 and 34. A part of a bit line 43 formed on the interlayer insulating film 42 fills the contact hole and is connected to the source region 33S. The bit line 43 has a triplex structure comprising TiN layers sandwiching an Al layer. The gate electrode 33G extends in the direction perpendicular to the bit line 43, and works also as a word line. The steps so far can be carried out by the conventional semiconductor manufacturing process.

The interlayer insulating film 42 and the bit line 43 are covered with a protection film 44. The protection film 44 is formed with any one of the methods described in the first to third embodiments. Because the protection film 44 has high moisture resistivity, the protection film 44 prevents the characteristics of the ferroelectric memory device from deteriorating. The interlayer insulating films 34 and 42 may be deposited by the methods described in the first to third embodiments.

The present invention is not limited to the embodiments described above, and various modifications/changes can be made.

What is claimed is:

1. A method of manufacturing the device using a ferroelectric film comprising:
    a forming step of forming a ferroelectric film on a principal surface of an underlying substrate;
    a depositing step of depositing a protection film consisting of silicon oxide and covering said ferroelectric film by vapor deposition using high density plasma and with source gases of $SiH_4$ and $O_2$ under conditions that a flow rate of $O_2$ is about twice and half as large as a flow rate of $SiH_4$, and
    further comprising a heating step of heating said underlying substrate in an inert gas atmosphere after said ferroelectric film forming step but before said protection film depositing step.

2. The method of manufacturing the device according to claim 1, wherein said protection film is deposited after said heating step, without exposing said underlying substrate to the atmosphere.

3. The method of manufacturing the device according to claim 1, wherein said underlying substrate is heated to at least 400° C. by said heating step.

4. A method of manufacturing a device using a ferroelectric film comprising:

a forming step of forming a ferroelectric film on a principal surface of an underlying substrate;

a heating step of heating said underlying substrate and said ferroelectric film in an inert gas atmosphere; and a depositing step of depositing a protection film consisting of fluorine added silicon dioxide after said heating step to cover said ferroelectric film by vapor deposition using high density plasma and with source gases of $SiF_4$ and $O_2$ under conditions that a flow rate of $O_2$ is about thrice as large as a flow rate of $SiF_4$, without exposing said underlying substrate to the atmosphere.

5. The method according claim 4, wherein said underlying substrate is heated to at least 400° C. by said heating step.

6. A method of manufacturing the device using a ferroelectric film comprising:

a forming step of forming a ferroelectric film on a principal surface of an underlying substrate; and a depositing step of depositing a protection film consisting of fluorine added silicon dioxide covering said ferroelectric film by vapor deposition using high density plasma using source gases of $SiF_4$ and $O_2$ under conditions that a flow rate of $O_2$ is about thrice as large as a flow rate of $SiF_4$.

7. The method of manufacturing the device according to claim 6, wherein said source gases comprises $SiF_4$ and $O_2$.

8. The method of manufacturing the device according to claim 6, wherein said protection film is deposited by said depositing step under conditions that a relative dielectric equals to 3.6 or greater.

9. A method of manufacturing the device using a ferroelectric film according to claim 1, wherein said high density plasma has an electron density equal to or greater than $1 \times 10^{12}$ cm$^3$.

10. A method of manufacturing a device using a ferroelectric film comprising:

a forming step of forming a ferroelectric film on a principal surface of an underlying substrate; and a depositing step of depositing a protection film covering said ferroelectric film by vapor deposition using high density plasma, wherein said protection film is deposited under a condition where $O_2$ gas flow rate is higher than $SiH_4$ has flow rate, a spectrum of the protection film by Fourier transform infrared spectroscopy has peaks corresponding to Si—O bonding at wave numbers of about 450 cm$^{-1}$, 820 cm$^{-1}$, and 1060 cm$^{-1}$, and does not have a peak corresponding to Si—H bonding at a wave number of about 850 cm$^{-1}$.

* * * * *